United States Patent [19]

Rodseth

[11] Patent Number: 4,461,593
[45] Date of Patent: Jul. 24, 1984

[54] SELF-ALIGNING MOUNTING ARRANGEMENT

[75] Inventor: William G. Rodseth, Elgin, Ill.

[73] Assignee: Illinois Tool Works Inc., Chicago, Ill.

[21] Appl. No.: 360,014

[22] Filed: Mar. 19, 1982

[51] Int. Cl.³ .............................................. F16B 5/02
[52] U.S. Cl. ........................................ 403/11; 403/14;
403/24; 403/281; 403/407; 411/427; 358/248;
248/544
[58] Field of Search .................. 403/11, 24, 407, 281,
403/279, 13, 14; 411/427, 44; 358/248, 249;
248/544, 558; 29/526 R

[56] References Cited

U.S. PATENT DOCUMENTS

| 2,092,341 | 9/1937 | DeVries | 248/544 |
| 3,116,816 | 1/1964 | Johnson | 403/281 |
| 3,782,056 | 1/1974 | Osteen | 403/11 |
| 3,932,050 | 1/1976 | Yahraus | 403/11 |

FOREIGN PATENT DOCUMENTS

| 458584 | 12/1936 | United Kingdom | 411/44 |
| 1237597 | 6/1971 | United Kingdom | 403/407 |

Primary Examiner—Cornelius J. Husar
Assistant Examiner—Joseph A. Fischetti
Attorney, Agent, or Firm—Thomas W. Buckman; Donald D. Mondul; David I. Roche

[57] ABSTRACT

A self-aligning mounting arrangement for aligning a fastener to secure a first workpiece to a second workpiece. The arrangement includes a plurality of bores each of substantially identical cross-sectional area in one of the workpieces. These bores are arranged in a matrix grid pattern having a predetermined grid dimension. The cross-sectional area of each bore is a predetermined fractional part of the average cross-sectional area of the fastener used to secure the two workpieces. The predetermined grid dimension is a predetermined proportion of a cross-sectional dimension of the fastener.

13 Claims, 6 Drawing Figures

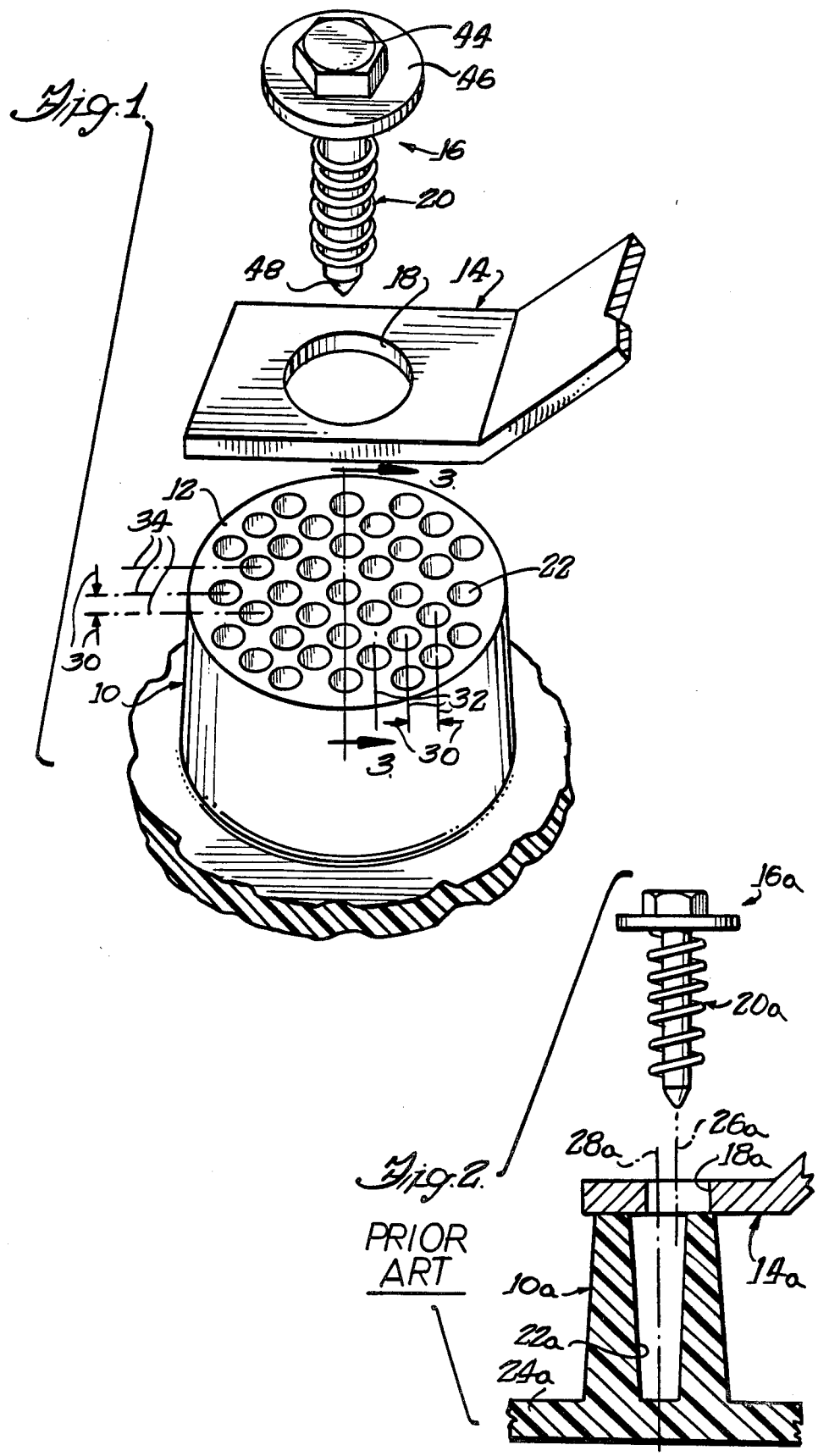

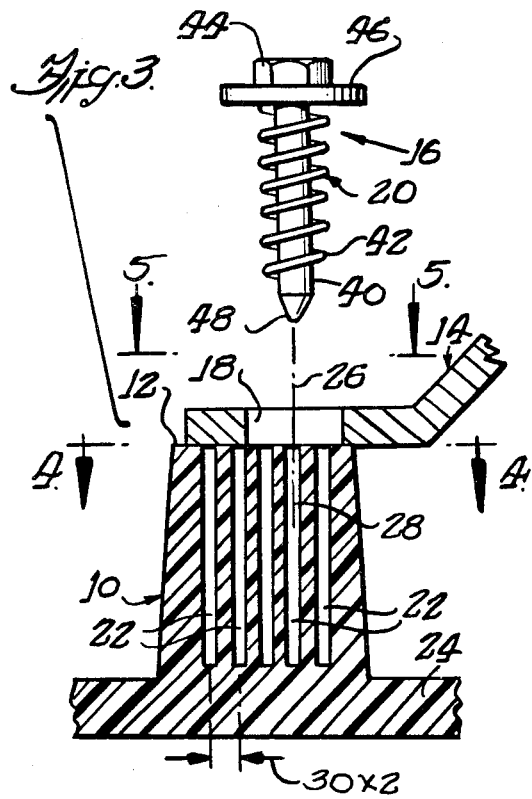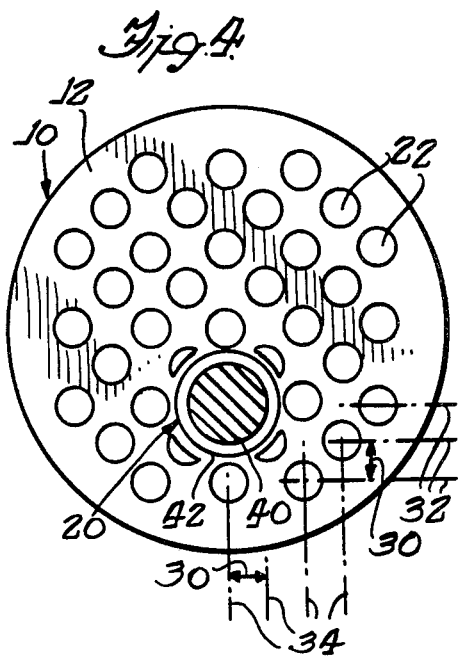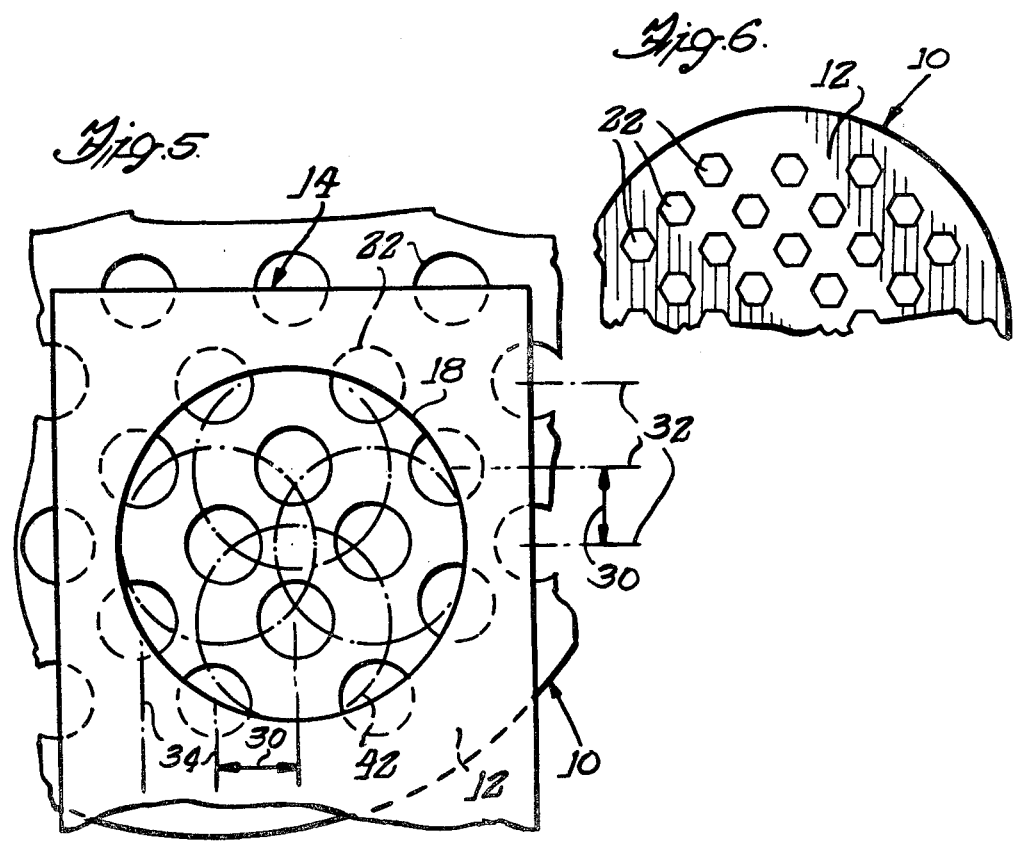

SELF-ALIGNING MOUNTING ARRANGEMENT

BACKGROUND OF THE INVENTION

The present invention is directed generally to a novel mounting or connecting arrangement and more specifically to a self-aligning mounting or connecting arrangement suitable for interconnecting two or more workpieces.

While various uses for the mounting arrangement in accordance with the invention may suggest themselves to those skilled in the art, the disclosure will be facilitated with reference to the problem of securing a mounting bracket to a raised embossment. For example, one or more plastic embossments are often provided as an integral part of a television cabinet, to which certain mounting brackets, for example, the picture tube mounting brackets, must be secured. In many instances there are tolerance discrepancies in the clearance apertures provided in the brackets and embossments, making alignment thereof for the insertion of a suitable fastener difficult or impossible. It will be appreciated that the problem is aggravated when a plurality of relatively fixed brackets must be aligned with like plurality of relatively fixed receiving embossments for the insertion of suitable fasteners therethrough.

It has been proposed to provide a box or other receiving mounting surface without a pilot hole and utilizing a self-tapping type of fastener. However, driving such a fastener requires considerable torque which may result in stripping of the fastener driver head. Moreover, a volume of material substantially equal to the volume of the fastener must be displaced in this operation. Such displacement may occur as a curl of material about the fastener thread which tends to be captured under the fastener head, preventing proper seating of the fastener. Moreover, such extruding of the material tends to shear and weaken the thread form resulting in a lowered strip torque of the completed assembly.

Additionally, considerable stress is imparted by such an operation to the receiving boss or surface, which frequently results in undesirable cracking of the boss or surface. Furthermore, the molding of a relatively large unrelieved boss, i.e., without any pilot hole, often results in uneven cross-sectional thickness, which may be objectional from either a standpoint of structural integrity or as a matter of appearance. Moreover, the amount of torque required to insert a self-tapping screw may result in operator fatigue if a hand-employed driver tool is used.

Various solutions employing enlarged apertures in one of the two workpieces have also been proposed. However, even such enlarged apertures may fail to align properly with facing fastener-receiving bores under many circumstances, particularly when a number of such apertures and bores in each of a pair of relatively fixed surfaces must be aligned and secured. In this regard, even a relatively small amount of misalignment between an aperture and a fastener receiving bore may result in interference from the periphery of the aperture during insertion of a fastener. Such interference may cause stripping and subsequent weakening of the fastener threads. Alternatively, such misalignment may cause uneven pressures to be applied to the bore, resulting in similar problems of insufficient strip torque and/or cracking as discussed above.

OBJECTS AND SUMMARY OF THE INVENTION

Accordingly, it is a general object of the invention to provide a self-aligning mounting arrangement which substantially avoids the problems of the prior art.

A more specific object is to provide such a mounting arrangement which provides alignment between a fastener and a receiving bore without interference from the periphery of the mating aperture over a surprisingly broad range of relative positions of the aperture and the bore.

A related object is to provide such a mounting system which provides sufficient relief for material displaced by entry of a fastener without imparting undue stress or axial material extrusion while achieving maximum strip torque.

Yet another object is to provide a mounting system in accordance with the foregoing objects which is relatively simple and inexpensive and yet highly reliable in operation.

In accordance with the invention, a self-aligning mounting arrangement is provided for aligning a fastener to secure a first workpiece to a second workpiece. This arrangement includes a plurality of bores each of substantially identical cross-sectional area in one of said workpieces. These bores are arranged in a matrix grid pattern having a predetermined grid dimension. The cross-sectional area of each bore is a predetermined fractional part of the average cross-sectional area of the fastener used to secure the two workpieces. The predetermined grid dimension is a predetermined proportion of a cross-sectional dimension of the fastener.

BRIEF DESCRIPTION OF THE DRAWINGS

The foregoing as well as other objects, features and advantages of the invention will be more readily appreciated upon reading the following detailed description of the illustrated embodiment together with reference to the accompanying drawings wherein:

FIG. 1 is a perspective view of an exemplary self-aligning mounting system in accordance with the invention;

FIG. 2 is a sectional view of a prior art mounting system;

FIG. 3 is a sectional view taken generally along the line 3—3 of FIG. 1;

FIG. 4 is a sectional view taken generally along the line 4—4 of FIG. 3 and illustrating a fastener fully advanced with respect thereto;

FIG. 5 is an enlarged view of a portion of a section taken generally along the line 5—5 of FIG. 3; and FIG. 6 is a reduced partial view similar to FIG. 4 illustrating an alternative embodiment of a portion of the invention.

DETAILED DESCRIPTION OF THE ILLUSTRATED EMBODIMENT

While the invention is useful for self-aligning mountings or connections in a variety of applications, the disclosure will be facilitated by specific reference to the problem of coupling a mounting bracket with a raised embossment or boss. Referring now to the drawings and initially to FIG. 1, a raised embossment or boss 10 provides a substantially flat, broad mounting surface 12 for receiving a mounting bracket 14. Preferably a threaded fastener 16 is utilized to mount the bracket 14 to the surface 12 of the boss 10. In this regard a suitable through aperture 18 is provided in the bracket 14 for receiving a threaded shank portion 20 of the fastener 16 therethrough. The boss 10 may be a part of a cabinet or other surface or frame member 24.

Referring briefly to FIG. 2, a typical prior art arrangement for mounting a similar bracket 14a to a similar boss 10a is illustrated. In accordance with conventional practice, a through aperture 18a in the bracket 14a receives the threaded shank portion 20a of a threaded fastener 16a therethrough. Cooperatively, the boss 10a includes a single bore 22a which is sized to provide a pilot hole for the threaded shank portion 20a of the fastener 16a. In this regard, the effective cross-sectional area of the bore 22a is smaller than the effective cross-sectional area of the threaded shank 20a. Hence, the shank 20a achieves an interconnection with the bore 22a which exhibits a relatively high strip torque.

However, the prior art arrangement encounters a number of problems should the through aperture 18a of the bracket 14a fail to align properly with the bore 22a of the boss 10a, as shown in FIG. 2. In this regard, a plurality of mounting brackets 14a are commonly utilized in conjunction with a like plurality of bosses 10a to achieve mounting of an object or component to a frame 24a of which the boss 10a is a part. Hence, such misalignment frequently occurs as between one or more of the through aperatures 18a and bores 22a.

In this regard, a line 26a which defines the central axes of both the through aperture 18a and the threaded shank 20a is misaligned with respect to a line 28a which defines the central axis of the bore 22a. Hence, the threaded shank 20a will encounter interference from the peripheral sides of the aperture 18a as it is advanced with respect to thereto and with respect to the bore 22a. Additionally, the bore 22a will experience a radially varying amount of material displacement upon threaded advancement of the threaded shank 20a. Both of these conditions are undesirable and may cause either stripping of the threads on the threaded shank 20a, undue stress and/or cracking of the boss 10, or both.

Referring now again to FIG. 1 and also to FIG. 3, the present invention substantially avoids such misalignment and the problems caused thereby. In this regard, the invention provides a boss 10 which has a somewhat enlarged cross-sectional area and hence an enlarged top surface 12 as compared to the boss 10a of FIG. 2. Rather than a single bore 22a as in the prior art (FIG. 2), the boss 10 in accordance with the invention carries a plurality of bores 22 arranged in a grid or matrix pattern. In accordance with a preferred form of the invention, each of these bores is substantially circular in cross-section and located at an intersection of the two lines of the grid pattern (as best seen In FIG. 1). Moreover, the grid pattern or matrix defined on the surface 12 of the boss 10 is a substantially orthogonal system of coordinates having a fixed, predetermined grid dimension 30 in both directions. That is, a plurality of parallel grid lines 32 are respectively separated by a like dimension 30 and similarly, a plurality of grid lines 34 run perpendicular to the grid lines 32 and are respectively separated by the same dimension 30. In accordance with a preferred form of the invention, the bores 22 are located at alternate intersections of respective grid lines 32 and 34.

From the description thus far, it will be seen that the cross-sectional area or diameter of the boss 10 has been increased somewhat in accordance with the invention to define an enlarged "target" area for the bracket 14 and hence for the threaded fastener 16. Advantageously, this allows a more liberal tolerance in the respective mating components and hence permits both simpler and relatively less costly manufacture thereof. Additionally, the provision of a plurality of bores on a grid pattern as thus far described permits the bracket and fastener 16 to align with any one of a plurality of the bores 22. This alignment is readily achieved over a relatively wide range of placements of the bracket 14 and aperture 18 therein with respect to the surface 12 of the boss 10.

Advantageously in this latter regard, as the threads 20 of the fastener 16 displace the material around a given pilot hole or bore 22, the adjacent pilot holes or bores 22 provide an ample relief volume for the displaced material. This relief substantially avoids over-stressing and possible cracking of the boss 10. Additionally, the torque necessary to drive the fastener 16 into a boss 10 is minimized by the arrangement of the invention, so as to avoid stripping of the fastener driver head or operator fatigue, if a hand operated driver tool is used. Moreover, the boss 10 with a plurality of bores 22 in accordance with the invention is surprisingly simple and inexpensive to mold. In this regard, such bosses 10 are preferably molded integrally with the cabinet or other surface 24. Accordingly, as will presently be seen, the matrix of bores 22 permits sufficient relief area for providing an acceptable level of drive torque in driving the fastener 16 without reducing the strip torque thereof once in place.

In accordance with a preferred form of the invention, a known relationship among the diameter or cross-sectional area of the bores 22, the matrix grid dimension 30, and the bracket through aperture 18 may be established. Additionally, the material from which the boss 10 is constructed is preferably a material exhibiting a flexural modulus of elasticity which allows some degree of material extrusion without severe stressing. Hence, thermal-set plastics for example are generally considered not suitable. However, many of the well-known self-extinguishing materials such as ABS and Norl, as well as polystyrene and like materials are preferred. Glass-reinforced materials, however, are generally not suitable.

The size of threaded fastener 16 may be readily determined by conducting drive-strip tests in material samples. Once suitable fastener size has been established, the sizes of the bores 22, the grid dimension 30 and the size of the aperture 18 may be determined.

In this regard, the threaded fastener 16 has a minor thread diameter 40 and a major thread diameter 42. Hence, the average cross-sectional area of the threaded shank 20 may be readily derived from these diameters. Moreover, the average screw cross-sectional area is approximately equal to the cross-sectional area of the shank portion of the screw blank from which the threaded shank 20 is formed. It has been found that to achieve optimum drive torque and strip torque, the amount of material displaced by entry of the screw or fastener 16 into a given bore 22 should not fill more than about 75 percent of the four closest surrounding bores 22. Hence, the preferred average cross-sectional area of each bore 22 can be readily determined, as follows:

$$Sa - Ba = 0.75\, Ba(4)$$

$$Sa = 4Ba$$

or $Ba = Sa/4$;

where Sa is the average fastener cross-sectional area, and Ba is the bore cross-sectional area. From the foregoing, it follows that:

$$Ba = \pi \sqrt{H}^2 \text{ where } \sqrt{H} = \text{bore radius}$$

$$Ba = \pi \frac{d_H^2}{4} \text{ where } d_H = \text{bore diameter}$$

and $$Sa = \pi \sqrt{sa}^2 \text{ where } \sqrt{sa} =$$

fastener average cross-sectional radius $$Sa = \pi \frac{d_{sa}2}{4} \text{ where } d_{sa} =$$

fastener average cross-sectional diameter from above $$Ba = \frac{sa}{4}$$

therefore $$\pi \frac{d_H^2}{4} = \pi \frac{d_{sa}2}{16}$$

therefore $$\frac{d_H}{2} = \frac{d_{sa}}{4}$$

and therefore $$d_H = \frac{d_{sa}}{2}$$

where $d_{Sa}$ is the diameter of the fastener average cross-sectional area and $d_H$ is the diameter of the bore, where the bores are circular in cross-section.

Preferably, the bore cross-sectional area and hence bore diameter should be held to a minimum so as to maximize the number of bores available in a given surface area 12 of the boss 10. Hence, the bore size should be minimized with respect to the average fastener cross-sectional area if possible. Hence, we prefer to utilize a threaded fastener 16 of the type wherein the minor thread diameter 40 is considerably smaller than the major thread diameter 42, resulting in a suitably small *average* cross-sectional area of the fastener 16.

Preferably the grid dimension 30 is chosen such that the radius which locates the four bores 22 closest to the bore entered by the fastener 16 is about 75 percent of the minor thread diameter 40 of the fastener 16. Hence:

Referring to FIG. 5, the aperture 18 is seen to encompass four of the bores 22 in their entirety. A worst-case assumption is made that a fastener 16 will have a point of entry as far as possible from any bore 22. Thus, a presumed point of entry will be located equidistant from all of the bores 22 which are wholly encompassed within the aperture 18 in FIG. 5. Therefore, the presumed point of entry will be a distance x from each of those four bore centers. Thus, the displacement between any two adjacent bores 22 is seen to be the hypotenuse of a right equilateral triangle having sides of length x, which triangle has its apex at the presumed point of entry. Hence, by Pythagoras' Theorem:

$0.75 \, Dmin = \sqrt{x^2 + x^2}$ where $Dmin$ = minor thread diameter therefore:

$0.75 \, Dmin = \sqrt{2x^2}$ and therefore:

$$x = \sqrt{\frac{(.75 \, Dmin)^2}{2}} \cong 0.49 \, Dmin.$$

where X is the grid dimension 30 and Dmin is the minor thread diameter 40.

Since the preferred matrix grid dimension 30 is proportional to the minor thread diameter 40, a preferred closely spaced matrix pattern of bores 22 also leads to a preferred type of fastener having a relatively small minor thread diameter 40 as mentioned above.

Finally, the optimum size of the through aperture 18 and the bracket 14 may be determined. Preferably, the diameter of this aperture 18 should be sufficient to assure that the fastener 16 having a major thread diameter 42 will readily center upon at least one of the bores 22 irrespective of the placement of the aperture 18 with respect to the matrix grid pattern, without interference from the sides of the aperture 18. Hence, $H \, clear = 2X + Dmaj;$ where H clear is the diameter of the aperture 18 and Dmaj is the major thread diameter 42.

The foregoing relationships are illustrated in FIG. 4 and FIG. 5 to which reference is also invited.

Referring briefly also to FIG. 6, it will be noted that the bores 22 need not be circular or cylindrical in accordance with the invention. Rather, bores 22 of various polygonal cross-sectional shape may be readily utilized. In this regard, it will be recalled that the grid spacing and cross-sectional area of these bores 22 are not affected by the cross-sectional shape thereof. Accordingly, in FIG. 6 one example of a polygonal cross-section, namely, a regular hexagon, is illustrated.

While the invention has been illustrated and described hereinabove with reference to preferred embodiments, the invention is not limited thereto. For example, the described matrix or grid pattern of bores may be provided in any surface which is to be connected with or mounted to another surface by means of a threaded fastener, while the other of the two surfaces to be so coupled is provided with a suitable through aperture as described above. Those skilled in the art may devise various alternatives, changes and modifications. The invention includes such changes, alternatives and modifications insofar as they fall within the spirit and scope of the appended claims.

The invention is claimed as follows:

1. A self-aligning mounting arrangement for mounting a bracket to an upstanding boss, comprising: a threaded fastener having a major diameter and a minor diameter, a plurality of bores of substantially identical cross-sectional area in said boss the depth of said bores being sufficient to receive at least a portion of said threaded fastener, said bores being arranged in a matrix grid pattern having a predetermined grid dimension, the cross-sectional area of each bore being a predetermined fractional part of the average cross sectional area of the threaded fastener and said predetermined grid dimension being a predetermined proportion of the minor thread diameter of said threaded fastener, such that upon entry of said threaded fastener into a given one of said bores, sufficient relief is provided by bores adjacent to said given bore for receiving material displaced by said fastener, while maintaining the fastener within said given bore.

2. A mounting arrangement according to claim 1 and further including a through opening in said bracket of a diameter sufficient to permit passage of said threaded fastener therethrough and into at least one of said bores without interference from said bracket, irrespective of the placement of said bracket relative to said grid pattern, so long as the major fractional portion of said bracket opening is aligned with said grid pattern.

3. A mounting arrangement according to claim 2 wherein said boss presents a surface to said bracket which is substantially greater in cross-section than said through opening in said bracket.

4. A mounting arrangement according to claim 3 wherein the cross-sectional area of each of said plurality of bores is on the order of substantially one-quarter of the average cross-sectional area of said threaded fastener.

5. A mounting arrangement according to claim 4 wherein said grid dimension is on the order of substantially one-half of a minor thread diameter of said threaded fastener.

6. A mounting arrangement according to claim 5 wherein said grid pattern describes a plurality of intersecting grid lines in a system of orthogonal plane coordinates defining the same grid dimension in both coordinates, and wherein said bores are substantially centered about alternate intersections of said grid lines.

7. A mounting arrangement according to claim 6 wherein said through opening in said bracket defines a diameter of substantially the sum of twice the grid dimension and a major thread diameter of said threaded fastener.

8. A mounting arrangement according to claim 1 or claim 7 wherein each of said plurality of bores is substantially circular in cross-section.

9. A mounting arrangement according to claim 1 or claim 7 whereby each of said plurality of bores defines a regular polygon in cross-section.

10. A mounting arrangement according to claim 8 wherein the diameter of the circle defined by the cross-section of each of said plurality of bores is substantially one-half of the average of said major diameter and said minor diameter of said threaded fastener.

11. A mounting arrangement according to claim 1 wherein said grid dimension is substantially 0.49 of the minor diameter of said threaded fastener.

12. A self-aligning mounting arrangement for aligning a fastener to secure a first workpiece to a second workpiece, comprising: a plurality of bores each of substantially identical cross-sectional area in one of said workpieces, said bores being arranged in a matrix grid pattern having a predetermined grid dimension and the cross-sectional area of each bore being a predetermined fractional part of the average cross-sectional area of the fastener used to secure the two workpieces and said predetermined grid dimension being a predetermined proportion of a cross-sectional dimension of said fastener.

13. A mounting arrangement according to claim 12 wherein the other of said two workpieces includes a through opening of a diameter sufficient to permit passage of said fastener therethrough and into at least one of said bores without interference from said second workpiece irrespective of the relative placement of said workpieces so long as a major fractional portion of said through opening is aligned with said grid pattern.

* * * * *